(12) United States Patent
Yamaguchi

(10) Patent No.: US 7,102,408 B2
(45) Date of Patent: Sep. 5, 2006

(54) INFORMATION PROCESSING APPARATUS WITH ADJUSTABLE SYSTEM CLOCK

(75) Inventor: Kazue Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 100 days.

(21) Appl. No.: 10/873,313

(22) Filed: Jun. 23, 2004

(65) Prior Publication Data

US 2005/0156648 A1 Jul. 21, 2005

(30) Foreign Application Priority Data

Jan. 20, 2004 (JP) ............................. 2004-011544

(51) Int. Cl.
*G06F 1/04* (2006.01)
(52) U.S. Cl. ...................................... 327/293; 327/144
(58) Field of Classification Search ..................... None
See application file for complete search history.

(56) References Cited

U.S. PATENT DOCUMENTS 5,768,213 A * 6/1998 Jung et al. ................. 365/233
6,003,118 A * 12/1999 Chen .......................... 711/167
6,028,816 A * 2/2000 Takemae et al. ............ 365/233
2004/0049708 A1* 3/2004 Thomas et al. ............. 713/500
2004/0232959 A1* 11/2004 Hohnel ....................... 327/147

FOREIGN PATENT DOCUMENTS

| JP | 3209511 | 9/1991 |
| JP | 2000-29561 | 1/2000 |
| JP | 2000-347764 | 12/2000 |

* cited by examiner

*Primary Examiner*—Terry D. Cunningham
*Assistant Examiner*—Thomas J Hiltunen
(74) *Attorney, Agent, or Firm*—Staas & Halsey LLP

(57) ABSTRACT

An information processing apparatus is constructed by a system PLL, a first unit, a second unit, and a system board on which they are mounted. A delay setting circuit in which a variation and delay elements (a gate delay and a line delay) which are equivalent to those of a clock tree circuit for a gate have been set at the designing stage is provided on a signal line of a system clock in the first unit to the second unit. A delay setting circuit in which a variation and delay elements which are equivalent to those of the clock tree circuit for the gate have been set at the designing stage is provided on a signal line of a clock gate signal to the second unit.

11 Claims, 12 Drawing Sheets

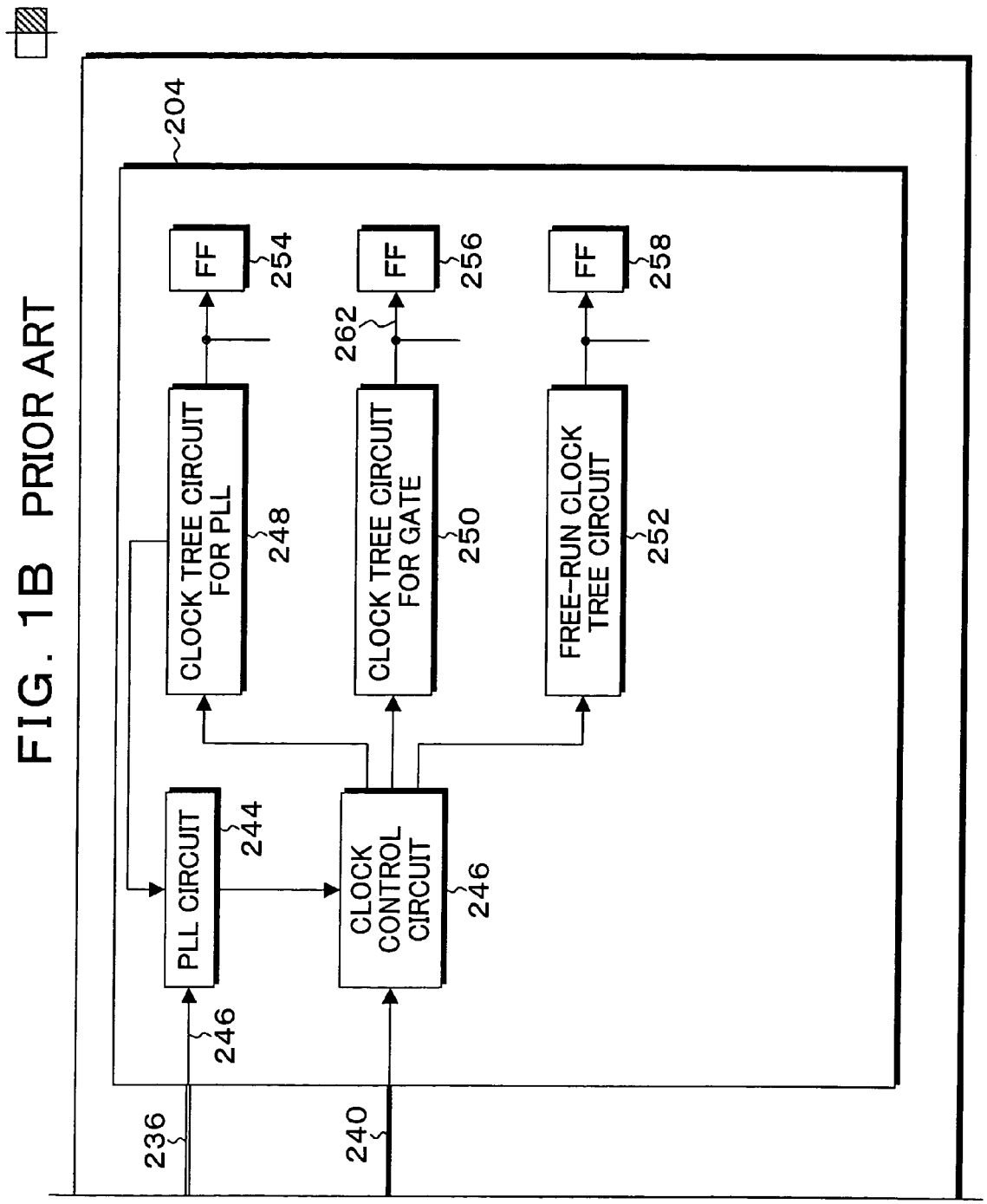

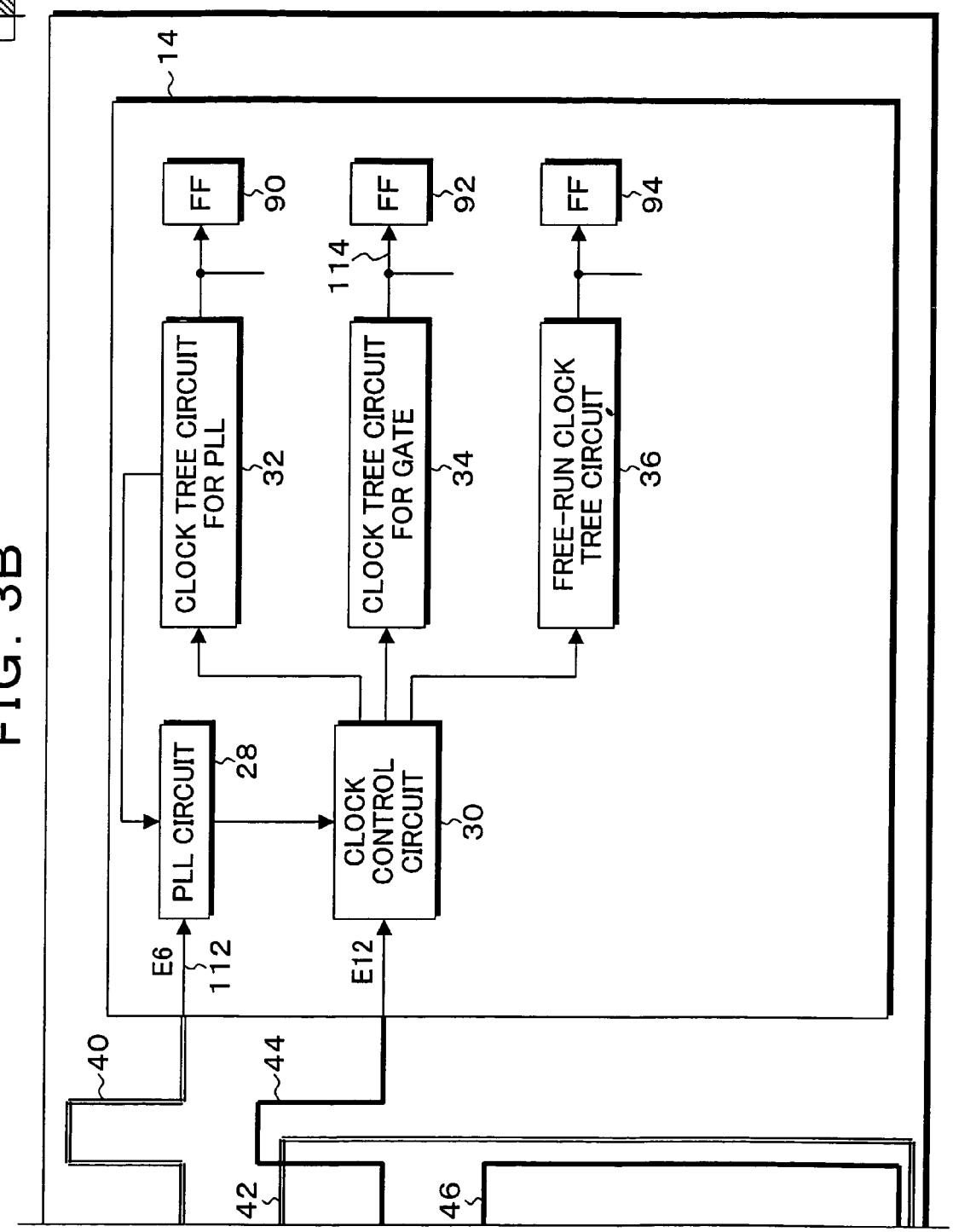

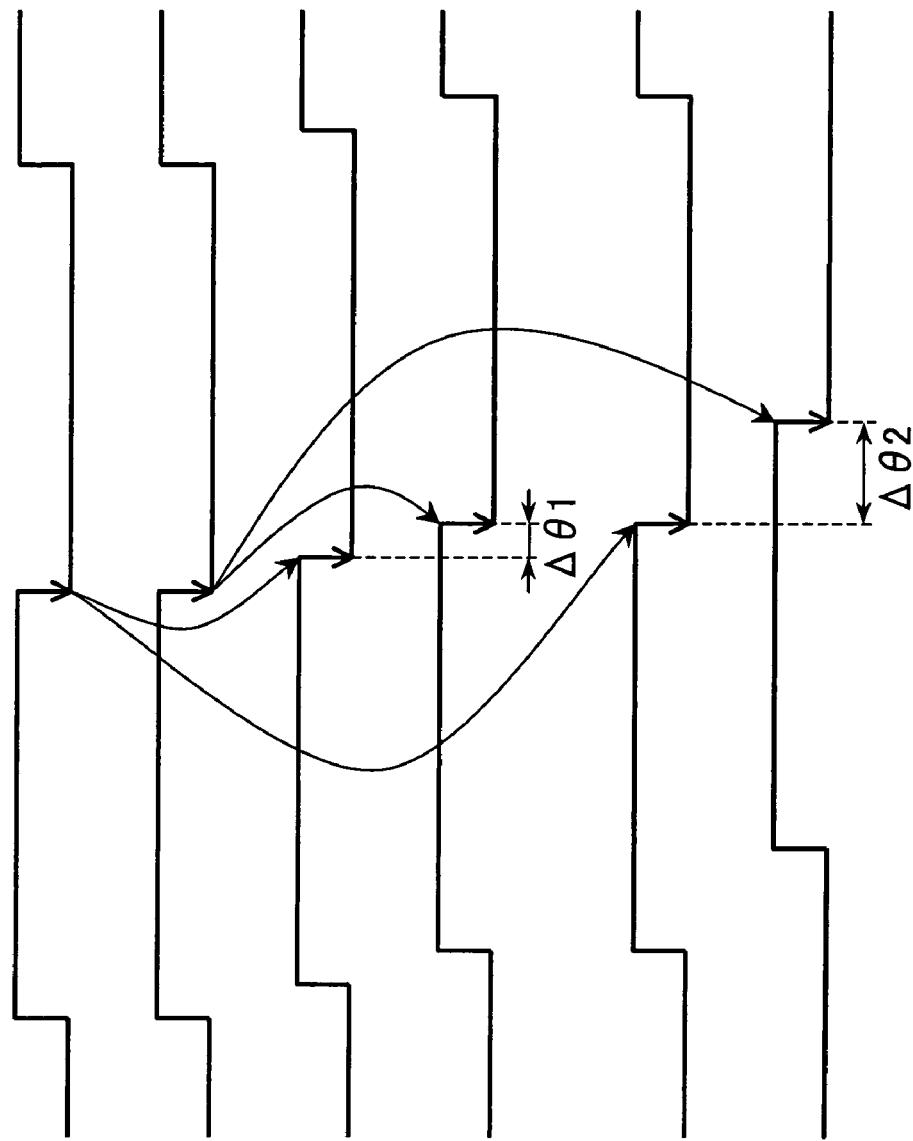

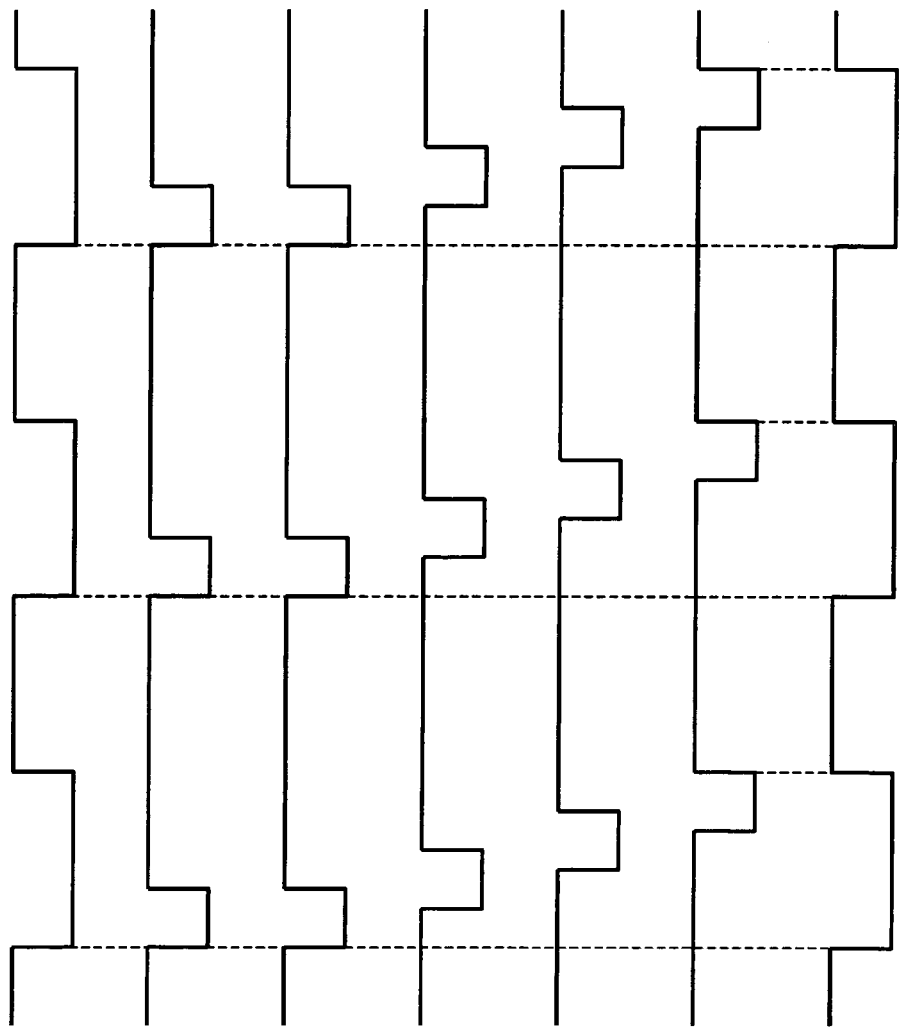

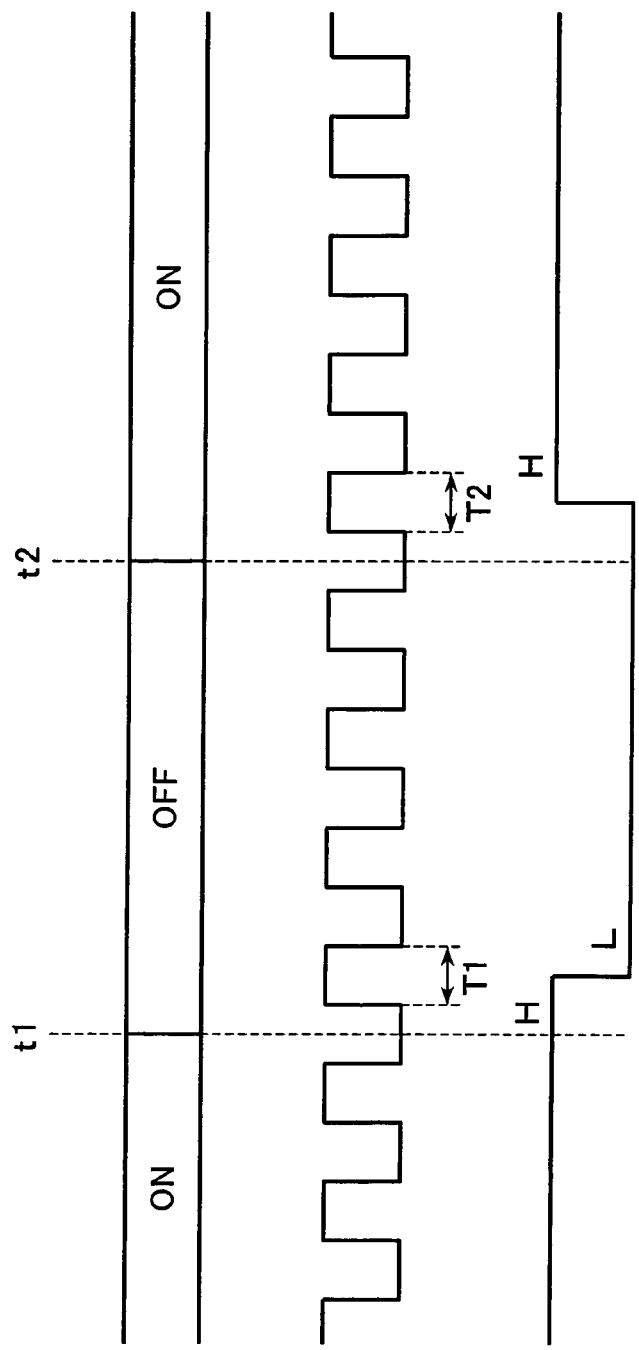
FIG. 8A ON/OFF INSTRUCTION
FIG. 8B SYSTEM CLOCK
FIG. 8C CLOCK GATE SIGNAL

INFORMATION PROCESSING APPARATUS WITH ADJUSTABLE SYSTEM CLOCK

BACKGROUND OF THE INVENTION

1. Field of the Invention

The invention relates to an information processing apparatus in which a plurality of units each comprising a semiconductor integrated circuit which operates on the basis of a system clock are arranged on a board and, more particularly, to an information processing apparatus in which a phase and a pulse width of the system clock which are caused by a variation on manufacturing the units can be adjusted.

2. Description of the Related Arts

Hitherto, in the development of an information processing apparatus such as a server or the like, realization of high reliability, reduction in costs, and decrease in number of shipping steps are very important subjects. Among them, for the realization of the high reliability, it is necessary to execute sufficient logic verification, a test for the guarantee of the margin operation in a severe environment, and the like. For the realization of the cost reduction, it is necessary to suppress product costs by reducing various expenses such as development expenses, testing expenses, and the like. Further, in order to realize the decrease in number of shipping steps, it is necessary to reduce various steps such as developing steps, testing steps, and the like. In the development of such a conventional information processing apparatus, in order to reduce the development expenses and decrease the developing steps and the testing steps, a new information processing apparatus is developed by assembling a new unit into a part of the information processing apparatus which has already been manufactured as a product. In this case, an adjustment of a system clock is necessary for fully utilizing functions implemented in the existing units without damaging the functions.

FIGS. 1A and 1B are an example of a conventional information processing apparatus which is made operative by a system clock and shows a clock system. In FIGS. 1A and 1B, a first unit 202 and a second unit 204 manufactured as LSIs are installed on a system board 200. For example, the second unit 204 is a processor and the first unit 202 is a control logic of the second unit. A system PLL circuit 206 as a system clock generator is provided for the first unit 202 and supplies the system clock to the second unit 204. A PLL circuit 244 as a clock generator exclusively for the second unit is provided for the second unit 204.

A phase and a pulse width of the system clock from the system PLL 206 are adjusted by a chopping circuit 210 and phase/width adjusting circuits 212 and 214. After that, the adjusted system clock is sent as a reference clock to the PLL 244 of the second unit 204 by a board line 236 and, at the same time, the system clock is supplied to a clock control circuit 222 of the first unit 202 itself by a board line 238. The system clock from the system PLL 206 is inputted to a clock gate generating circuit 216 of the first unit 202. On the basis of a control instruction of the supply and stop of the system clock which is given by a logic control circuit unit (not shown), for example, if the system clock is a minus clock, a clock gate signal which changes at timing during a clock plus period is formed and its phase is adjusted by delay adjusting circuits 218 and 220. After that, the clock gate signal is supplied to a clock control circuit 246 of the second unit 204 by a board line 240 and, at the same time, it is supplied to the clock control circuit 222 of the first unit 202 itself by a board line 242.

The clock control circuit 222 of the first unit 202 supplies a clock for a gate whose supply and stop have been controlled by the clock gate signal to a clock tree circuit 224 for a gate and, at the same time, supplies the continuous system clocks to a free-run clock tree circuit 226. The clock tree circuit 224 for the gate constructs, for example, a distributing circuit of four stages by distributing buffers 228-1 to 228-4 and supplies a clock to a gate of a control circuit (not shown). In this example, gates 232-1 and 232-2 serving as distribution destinations of the distributing buffer 228-4 of the final stage are shown. The free-run clock tree circuit 226 also similarly constructs a distributing circuit of four stages by distributing buffers 230-1 to 230-4 and supplies a free-run clock to a gate of a control circuit (not shown). A gate 234 serving as a distribution destination of the distributing buffer 230-4 of the final stage is shown as an example.

The clock control circuit 246 of the second unit 204 supplies a clock for a PLL which is not stopped by the clock gate signal from the first unit 202 to a clock tree circuit 248 for a PLL, supplies the clock for the gate whose supply and stop have been controlled by the clock gate signal to a clock tree circuit 250 for a gate, and at the same time, supplies the continuous system clocks to a free-run clock tree circuit 252. The clock tree circuit 248 for the PLL, the clock tree circuit 250 for the gate, and the free-run clock tree circuit 252 are constructed by an arbitrary number of distribution stages in accordance with a control logic circuit serving as a clock supply destination. Gates 254, 256, and 258 of the final stages are shown as examples. It is assumed that in such a system clock system of the first unit 202 and the second unit 204, it is necessary that a phase relation between, for example, a clock 260 which is inputted to the gate 232-1 of the final stage in the clock tree circuit 224 for the gate of the first unit 202 and a clock 262 which is inputted to the gate 256 of the final stage in the clock tree circuit 250 for the gate of the second unit 204 is kept constant.

The second unit 204 has the PLL 244, the clock of the clock tree circuit 248 for the PLL corresponding to the clock 262 is fed back, and an automatic adjustment is made so as to make a phase of the clock coincide with that of the system clock. Therefore, it is sufficient that the adjustment of the phase relation with the clock 260 is made with respect to a clock 264. To adjust the phase relation between the clock 260 of the first unit 202 and the clock 264 of the second unit 204 so as to be constant, hitherto, a clock adjustment testing apparatus is used, the system clock is supplied to the system board 200, the phase relation between the clocks 260 and 264 is actually measured, and delay values of the phase/width adjusting circuits 212 and 214 and the delay adjusting circuits 218 and 220 provided in the first unit 202 are adjusted, respectively. (Refer to JP-A-2000-029561, JP-A-2000-347764, and JP-A-3-209511.)

However, in the adjustment of the system clock in the conventional information processing apparatus as mentioned above, since the clock adjustment testing apparatus is used, there is such a problem that expenses for testing facilities and a testing step are caused. In the conventional apparatus, as circuits for adjusting the phases until the clock 260 or 264 is obtained from the system PLL 206 as a clock oscillating source, for example, phase/width adjusting circuits 212 and 214 and the delay adjusting circuits 218 and 220 in the first unit 202 have to be provided and a total delay time of the clock increases. Thus, a phase fluctuation due to environmental conditions or the like increases and it becomes a factor of obstructing the margin guarantee.

SUMMARY OF THE INVENTION

According to the invention, there is provided an information processing apparatus in which an adjustment of a system clock by a clock adjustment testing apparatus is unnecessary, a guarantee of a margin operation in a severe environment is further enhanced, and high reliability, a cost reduction, and a decrease in shipping steps can be realized.

An information processing apparatus of the invention comprises: a system clock generator; a first unit; one or a plurality of second units; and a system board on which those component elements are mounted.

The system clock generator oscillates the system clock. The first unit comprises: a clock gate generating unit which generates a clock gate signal for controlling supply and stop of the system clock; a clock control unit which controls the supply and stop of the system clock on the basis of the clock gate signal; and a clock distributing unit which distributes the system clocks outputted from the clock control unit to a control circuit unit and makes the control circuit unit operative. The second unit comprises: a clock generator which uses the system clock outputted from the first unit as a reference clock, feeds back the system clock at a predetermined circuit position, and generates the phase-coincident system clocks; a clock control unit which controls the supply and stop of the system clock outputted from the system clock generator on the basis of the clock gate signal obtained from the first unit; and a clock distributing unit which distributes the system clocks outputted from the clock control unit to the control circuit unit and makes the control circuit unit operative. The system clock generator, the first unit, and the second unit are mounted on the system board. The system board has board lines for individually supplying each of the system clock and the clock gate signal which are outputted from the first unit to the first unit itself and the second unit.

According to the invention, such an information processing apparatus is characterized by comprising: a first delay setting unit which is provided for a signal supply line of the system clock in the first unit to the second unit and in which a variation and delay elements which are equivalent to those of the clock distributing unit of the first unit have been set; and a second delay setting unit which is provided for a signal supply line of the clock gate signal in the first unit to the second unit and in which the variation and the delay elements which are equivalent to those of the clock distributing unit of the first unit have been set.

The clock control unit of the first unit outputs a clock for a gate whose supply and stop have been controlled by the clock gate signal and continuous free-run clocks in parallel. The clock distributing unit of the first unit comprises: a clock tree circuit for a gate which distributes the clock for the gate; and a free-run clock tree circuit which distributes the free-run clock. The first and second delay setting units of the first unit set a gate delay and a line delay which are equivalent to those of the clock tree circuit for the gate. Specifically speaking, the first and second delay setting units set the gate delay and the line delay which are equivalent to those of a circuit from a distribution start point in the clock distributing unit of the first unit to a predetermined gate input of the final end. The first and second delay setting units of the first unit set the gate delay and the line delay by a circuit in which a plurality of inverters are connected like a chain.

On the system board, a line length of a board line for supplying the system clock from the first unit to the first unit itself and that of a board line for supplying the system clock from the first unit to the second unit are the same. A line length of a board line for supplying the clock gate signal from the first unit to the first unit itself and that of a board line for individually supplying the clock gate signal from the first unit to the second unit are also the same. On the system board, a line length of a board line for supplying the system clock from the first unit to the first unit itself is different from that of a board line for supplying the system clock from the first unit to the second unit by a predetermined line length. A line length of a board line for supplying the clock gate signal from the first unit to the first unit itself is also different from that of a board line for individually supplying the clock gate signal from the first unit to the second unit by the same predetermined line length. A predetermined phase relation is set by the delay setting using the difference between the line lengths.

The first unit is further characterized in that: a phase/width adjusting circuit which adjusts a phase and a pulse width of the system clock, a bypass circuit which bypasses the phase/width adjusting circuit, and a selecting unit which selects one of outputs of the phase/width adjusting circuit and the bypass circuit and inputs the selected output to the first delay setting unit are provided on the input side of the first delay setting unit; and a phase adjusting circuit which adjusts a phase of the clock gate signal, a bypass circuit which bypasses the phase adjusting circuit, and a selecting unit which selects one of outputs of the phase adjusting circuit and the bypass circuit and inputs the selected output to the first delay setting unit are provided between the clock gate generating circuit and the second delay setting unit. The first unit is further characterized in that: a phase/width adjusting circuit which adjusts a phase and a pulse width of the system clock, a bypass circuit which bypasses the phase/width adjusting circuit, and a selecting unit which selects one of outputs of the phase/width adjusting circuit and the bypass circuit and outputs the selected output to the board line are provided for the signal supply line in the unit of the system clock to its own clock control unit; and a phase adjusting circuit which adjusts a phase of the clock gate signal, a bypass circuit which bypasses the phase adjusting circuit, and a selecting unit which selects one of outputs of the phase adjusting circuit and the bypass circuit and outputs the selected output to the board line are provided for the signal supply line of the clock gate signal which is outputted from the clock gate generating circuit.

The clock control unit of the second unit outputs in parallel: a clock for a clock generator which is not stopped by the clock gate signal; a clock for a gate whose supply and stop have been controlled by the clock gate signal; and continuous free-run clocks. The clock distributing unit of the second unit comprises: a clock tree circuit for the clock generator which distributes the clocks for the clock generator; a clock tree circuit for a gate which distributes the clocks for the gate; and a free-run clock tree circuit which distributes the free-run clocks. Further, the system clock generator can be provided in the first unit.

According to the invention, the first and second delay setting circuits each having the gate delay and the line delay which are equivalent to those of the circuit system of the clock distributing circuit which needs the adjustment of the phase relation in the first unit are provided in the same unit with respect to each of the system clock and the clock gate signal which are supplied from the first unit to the second unit having the clock generator (PLL) having the automatic adjusting function of the phase relation. Thus, the predetermined phase relation with the second unit is determined at the designing stage of the first unit, the clock adjustment using the clock adjustment testing apparatus at the stage of manufacturing the system board becomes unnecessary, the expenses for the testing facilities and the number of testing steps for the clock adjustment are reduced and the various expenses such as development expenses, testing expenses, and the like are reduced, so that the product costs can be suppressed.

The reduction in guarantee of the margin operation in a severe environment is caused by a variation in manufacturing stages of the LSIs. However, since the circuit system of the clock distributing circuit for keeping the phase relation of the clocks constant and the delay setting circuit for adjusting the phase relation with the other unit are provided in the same unit, they have the same manufacturing variation and variations for a change in use environment are equal. Therefore, the guarantee of the margin operation can be enhanced even in the severe environment. Further, since the board line length of the system clock system in the first unit itself and the board line length of the system clock system from the first unit to the second unit are the same and it is unnecessary to adjust the line delays of the board lines at the designing stage, the clock adjustment using the clock adjustment testing apparatus can be made unnecessary at the completion stage of the system board.

The above and other objects, features, and advantages of the present invention will become more apparent from the following detailed description with reference to the drawings.

BRIEF DESCRIPTION OF THE DRAWINGS

FIGS. 1A and 1B are explanatory diagrams of a clock phase adjustment in a conventional information processing apparatus;

FIGS. 3A and 3B are explanatory diagrams of an embodiment of a clock system according to the invention in the system board in FIG. 2;

FIGS. 6A to 6F are time charts showing states of a clock phase adjustment according to the invention in comparison with a conventional example;

FIGS. 7A to 7G are time charts for the adjusting operation which is executed by a chopping circuit and phase/width adjusting circuits in FIGS. 3A and 3B;

FIGS. 8A to 8C are time charts for the processing operation of a clock gate generating circuit in FIGS. 3A and 3B.

DETAILED DESCRIPTION OF THE PREFERRED EMBODIMENTS

Figure 2:
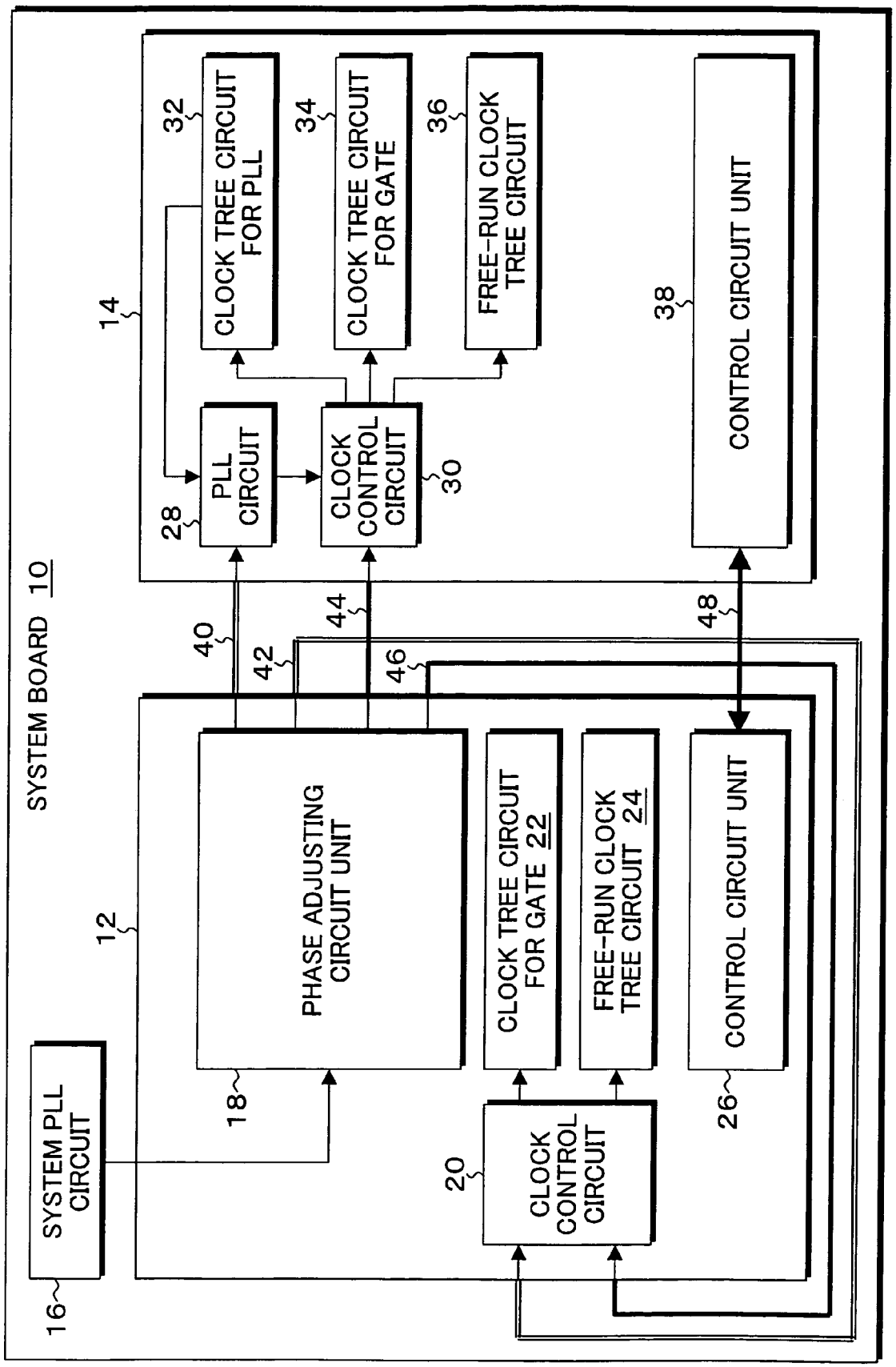
FIG. 2 is an explanatory diagram of a system board to which an information processing apparatus of the invention is applied.

FIG. 2 is a schematic explanatory diagram of an installing state of a system board to which an information processing apparatus of the invention is applied. In FIG. 2, in an embodiment, a first unit 12 and a second unit 14 are arranged on a system board 10. A system PLL circuit 16 which operates as a system clock generator is provided on the system board 10. A system clock generated by the system PLL circuit is supplied to the first unit 12. The second unit 14 has a PLL circuit 28 as a clock generator in the unit and can automatically adjust a phase relation with a clock at an internal arbitrary gate position by using the system clock obtained via the first unit 12 as a reference clock. The second unit 14 is, for example, a processor. The first unit 12 is provided as, for example, a logic control circuit for the processor as a second unit 14.

The first unit 12 has: a phase adjusting circuit unit 18; a clock control circuit 20; a clock tree circuit 22 for a gate; a free-run clock tree circuit 24; and further, a control circuit unit 26 which receives the supplied system clock and operates. Each circuit unit in the first unit 12 is a large scale semiconductor integrated circuit (LSI) which is manufactured on the basis of a circuit design by a computer-aided design (CAD). The second unit 14 has a PLL circuit 28, a clock control circuit 30, a clock tree circuit 32 for a PLL, a clock tree circuit 34 for a gate, and a free-run clock tree circuit 36 as a clock system. The second unit 14 also has a control circuit unit 38 which receives clocks outputted from such a clock system and operates.

As will be clearly explained hereinafter, a system clock and a clock gate signal are individually outputted from the phase adjusting circuit unit 18 of the first unit 12 to the first unit 12 itself and the second unit 14. Therefore, the first unit 12 and the second unit 14 are connected by a board line 40 for the system clock and a board line 44 for a clock gate. The first unit 12 is also connected to the first unit 12 itself by a board line 42 for the system clock and a board line 46 for a clock gate. The control circuit unit 26 of the first unit 12 and the control circuit unit 38 of the second unit 14 are connected by a bus 48. Bus lines such as data bus, control bus, and the like are included in the bus 48.

Figure 3A:
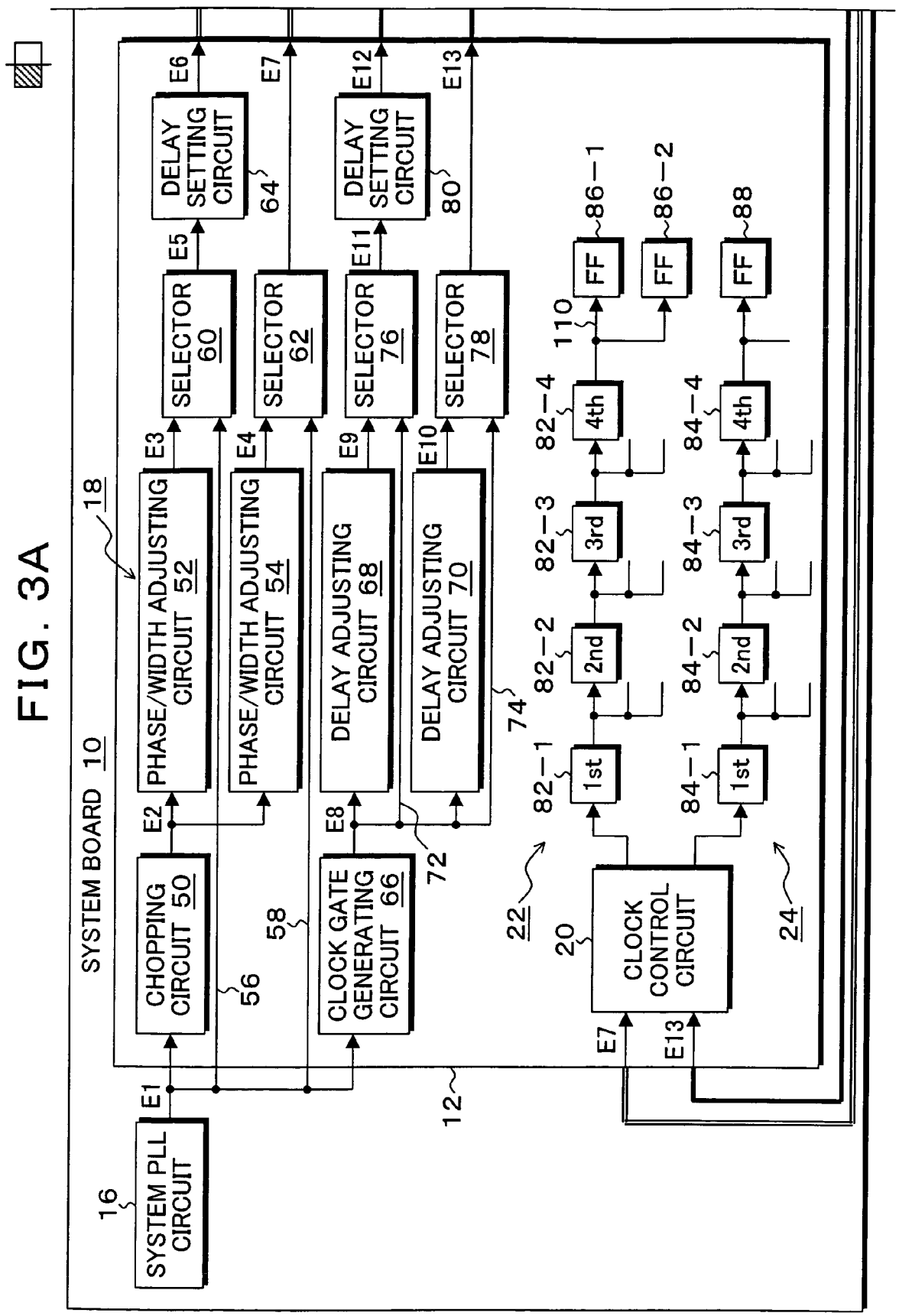

FIGS. 3A and 3B are explanatory diagrams of an embodiment of the clock system according to the invention in the system board 10 in FIG. 2. In FIGS. 3A and 3B, in order to adjust the system clock, a chopping circuit 50, phase/width adjusting circuits 52 and 54, bypass circuits 56 and 58, selectors 60 and 62, and a delay setting circuit (first delay setting circuit) 64 are provided for the phase adjusting circuit unit 18 of the first unit 12 which receives a system clock E1 supplied from the system PLL circuit 16. As a clock gate system for controlling supply and stop of the system clock, a clock gate generating circuit 66, delay adjusting circuits 68 and 70, bypass circuits 72 and 74, selectors 76 and 78, and a delay setting circuit (second delay setting circuit) 80 are also provided for the phase adjusting circuit unit 18.

Figure 1A:
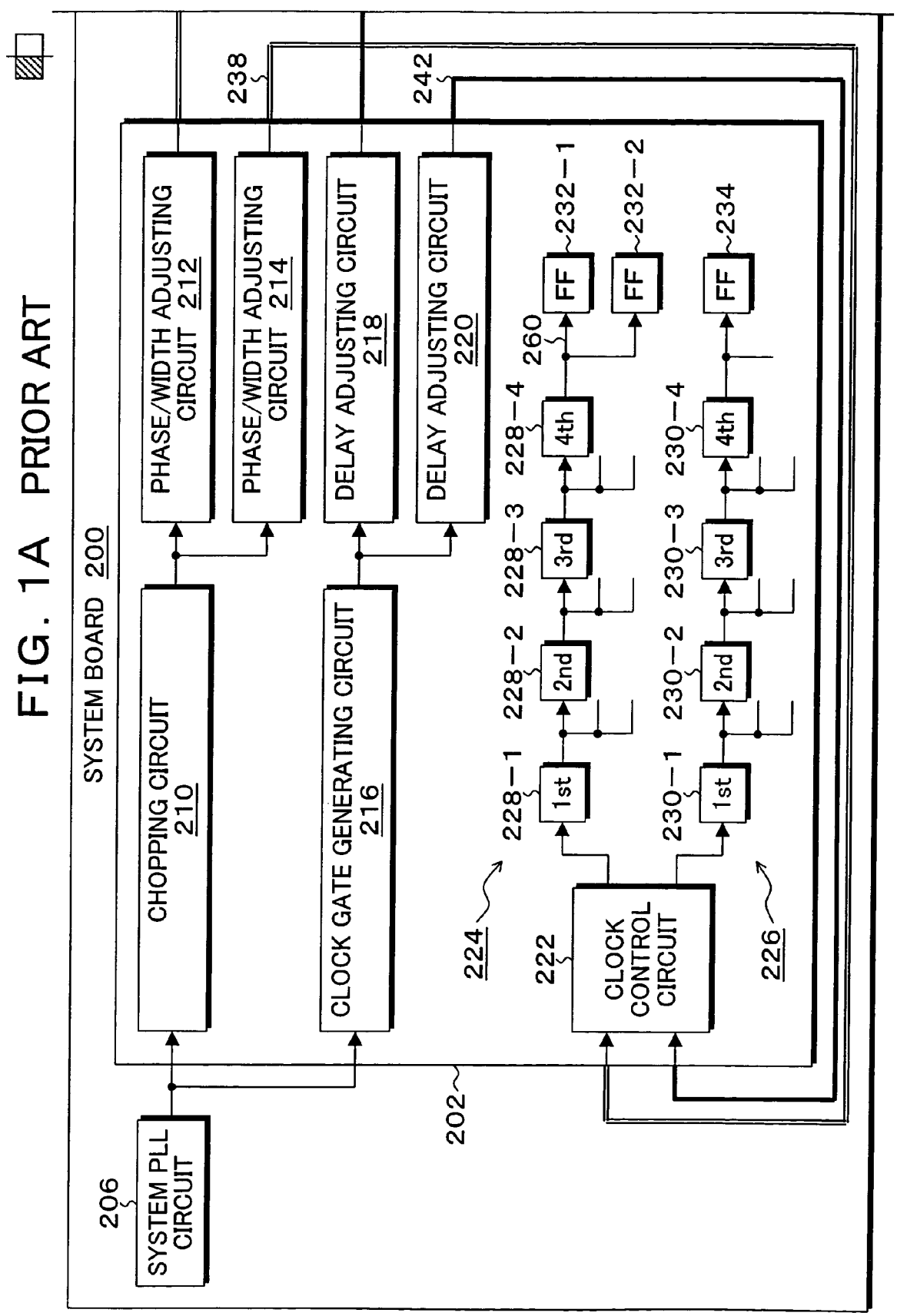

The chopping circuit 50, the phase/width adjusting circuits 52 and 54, the clock gate generating circuit 66, and the delay adjusting circuits 68 and 70 correspond to the phase adjusting circuit system provided for the first unit 202 of the conventional apparatus shown in FIGS. 1A and 1B. In addition to them, according to the invention, the delay setting circuits 64 and 80 and the bypass circuits 56, 58, 72, and 74 which are selected by the selectors 60, 62, 76, and 78 are newly provided.

In the phase adjusting circuit unit 18 of the first unit 12, the selectors 60, 62, 76, and 78 have fundamentally selected the bypass circuits 56, 58, 72, and 74, so that the system clock E1 from the system PLL circuit 16 and a clock gate signal E8 from the clock gate generating circuit 66 are passed with a minimum delay. A system clock E5 selected by the selector 60 is delayed by the delay setting circuit 64 newly provided in the invention, thereafter, transmitted as a system clock E6 via the board line 40 for the system clock, and inputted as a reference clock to the PLL circuit 28 of the second unit 14. A clock gate signal E11 outputted from the selector 76 is delayed by the delay setting circuit 80, thereafter, transmitted as a clock gate signal E12 via the board line 44 for the clock gate signal, and inputted to the clock control circuit 30 of the second unit 14. A system clock E7 from the selector 62 is inputted as it is to the clock control circuit 20 of the first unit 12 itself via the board line 42 for the system clock. Similarly, a clock gate signal E13 from the selector 78 is also inputted as it is to the clock control circuit 20 of the first unit 12 itself via the board line 46 for the clock gate.

The clock tree circuit 22 for the gate and the free-run clock tree circuit 24 are provided on the output side of the clock control circuit 20 and distribute the system clocks which are necessary for the whole control circuit unit 26 in FIG. 2 provided for the first unit 12. In the embodiment, the clock tree circuit 22 for the gate is constructed by four stages of distributing buffers 82-1 to 82-4. Gates 86-1 and 86-2 are shown as examples with respect to an output of the distributing buffer 82-4 of the final stage. The free-run clock tree circuit 24 is also constructed by four stages of distributing buffers 84-1 to 84-4. A gate 88 is shown as an example with respect to an output of the distributing buffer 84-4 of the final stage.

A system clock system of the second unit 14 is substantially the same as that shown in FIG. 2. Gates 90, 92, and 94 each of which receives a distribution output of the final stage are shown as examples with respect to the clock tree circuit 32 for the PLL, the clock tree circuit 34 for the gate, and the free-run clock tree circuit 36, respectively. The number of distribution stages of each clock tree on the second unit 14 side is set to an arbitrary number in accordance with the state of the clock supply to the control circuit unit. With respect to the information processing apparatus comprising the first unit 12 and the second unit 14 arranged on the system board 10 as mentioned above, the following embodiment will be described on the assumption that it is necessary to provide a predetermined phase relation between, for example, a clock 110 which is inputted to the gate 86-1 serving as a distribution output of the distributing buffer 84-4 in the clock tree circuit 22 for the gate of the first unit 12 and a clock 114 which is inputted to the gate 92 of the clock tree circuit 34 for the gate of the second unit 14.

The second unit 14 has the PLL circuit 28 therein and feeds back the clock corresponding to the clock 114 which is inputted from the clock tree circuit 32 for the PLL to the gate 92 of the clock tree circuit 34 for the gate. Thus, the PLL circuit 28 automatically adjusts the clock so as to eliminate a phase error of the clock 114 by using a clock 112 which is inputted as a system clock E6 as a reference clock. Therefore, the phase relation of the clock 114 is the same as that of the clock 112 as an input of the PLL circuit 28, so that it is sufficient to adjust so as to obtain a predetermined phase relation between the clock 110 of the first unit 12 and the clock 112 of the second unit 14.

In the invention, as a delay setting circuit (first delay setting circuit) 64 for adjustment of the system clock provided for the first unit 12, a circuit in which a variation and delay elements which are equivalent to those of the clock tree circuit 22 for the gate provided for the first unit 12 is formed. That is, the circuit element having a gate delay and a line delay, as delay elements, in the tree circuit from the input of the distributing buffer 82-1 in the clock tree circuit 22 for the gate to the output of the distributing buffer 82-4 of the final stage are provided for the delay setting circuit 64. Thus, a variation in circuit structure upon manufacturing the clock tree circuit 22 for the gate is reflected as it is to the delay setting circuit 64. The gate delay and the line delay which are equal to those of the clock tree circuit 22 for the gate in the delay setting circuit 64 are obtained at the stage of circuit design by the CAD of the first unit 12. The circuit is designed by using those delays as delay elements of the delay setting circuit 64.

Figure 4:
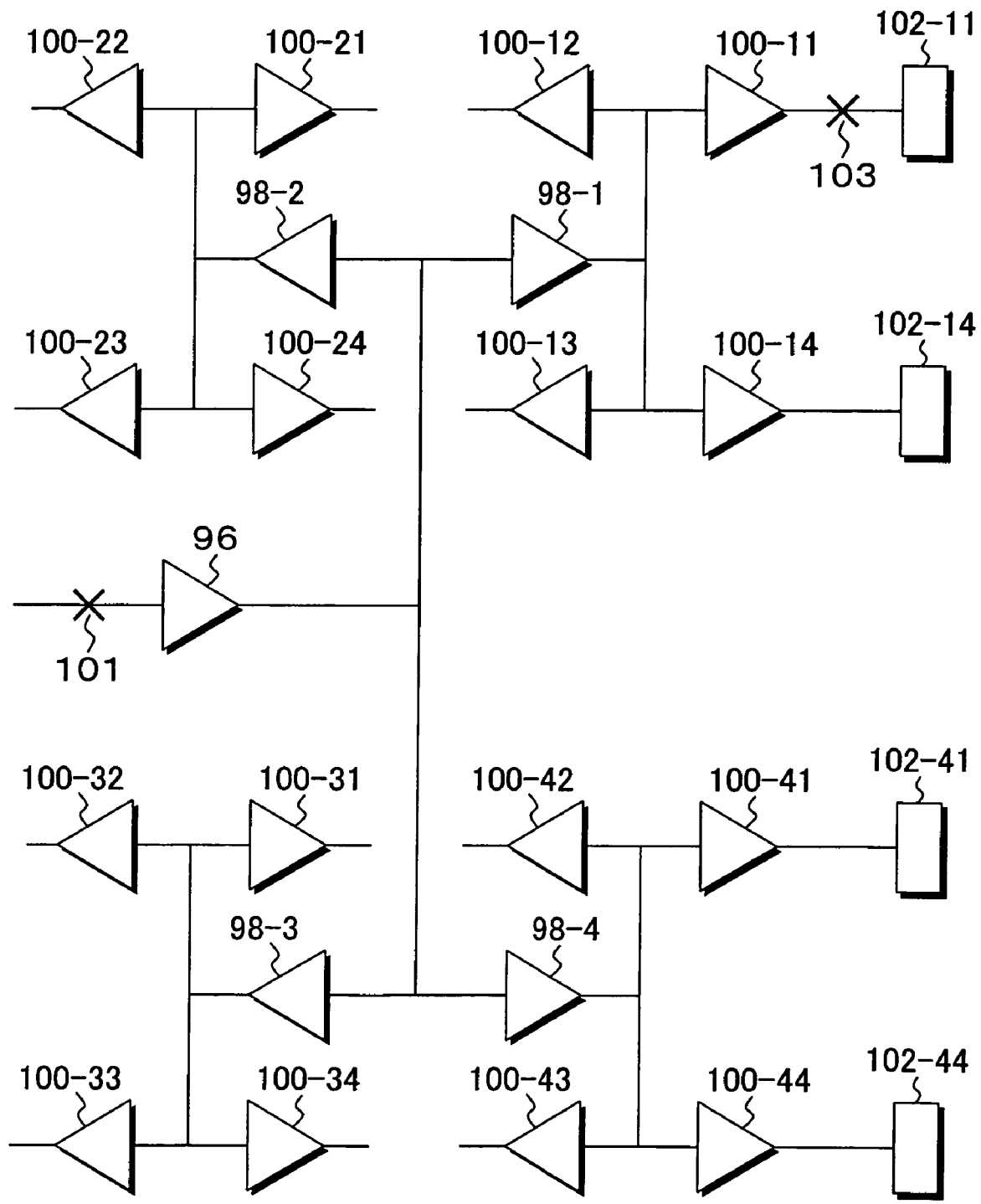
FIG. 4 is a circuit diagram of a clock tree circuit of an H distribution type in a first unit in FIGS. 3A and 3B.

FIG. 4 shows an example of a specific circuit of the clock tree circuit 22 for the gate in FIGS. 3A and 3B and the clock tree circuit of an H distribution type is shown as an example. In the clock tree circuit of the H distribution type, a distributing buffer 96 corresponds to the first stage, next distributing buffers 98-1 to 98-4 correspond to the second stage, and further next distributing buffers 100-11 to 100-44 correspond to the third stage. In the example, gates 102-11, 102-14, 102-41, and 102-44 are shown as examples at outputs of the distributing buffers 100-11, 100-14, 100-41, and 100-44 of the third stage, respectively. It is sufficient to H-distribute the output sides of the distributing buffers 100-11 to 100-44 further as a fourth stage. A gate delay and a line delay in the path from an input point 101 of the distributing buffer 96 of the first stage to an output point 103 of the distributing buffer 100-11 of the third stage are also equivalent to those of the other distributing buffers 100-11 to 100-44 of the third stage, respectively. Therefore, the clock tree circuit 22 for the gate in the first unit 12 in FIGS. 3A and 3B is constructed as an H distribution type and with respect to the clock 110 of the input point to one gate 86-1 of the buffer 82-4 of the fourth stage, if the phase relation with the clock 112 corresponding to the clock 114 of the second unit 14 can be adjusted to be constant, the phase relations can be similarly adjusted to be constant with respect to all of the outputs of the same distribution stage.

Figure 5:
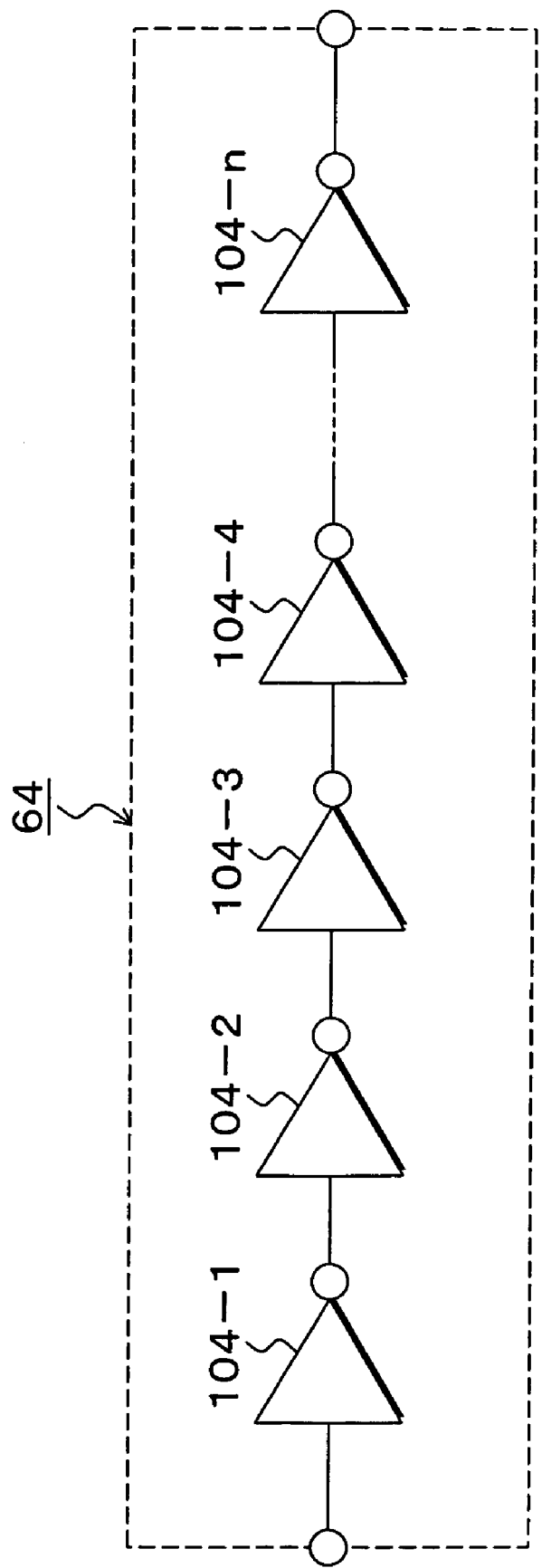
FIG. 5 is a circuit diagram of a delay setting circuit provided in the first unit in FIGS. 3A and 3B.

FIG. 5 is a specific circuit construction of the delay setting circuit 64 in the first unit in FIGS. 3A and 3B. In the delay setting circuit 64, a plurality of inverters 104-1 to 104-n are delay-connected from the input to the output. Naturally, the number (n) of inverters is set to a multiple of 2 in order to make an input logic and an output logic of the inverter delay coincide with each other. By the delay of the (n) inverters as mentioned above, the delay setting circuit 64 having the gate delay and the line delay which are equivalent to those of the clock system from the input stage of the clock tree circuit 22 for the gate in the first unit 12 in FIGS. 3A and 3B to the input of the gate 86-1 from which the clock 110 is obtained is constructed. The delay setting circuit 64 does not correspond to the clock tree circuit 22 for the gate itself but to the clock system of one system from the input in the clock tree circuit 22 for the gate to a position of the clock 110 which shows a circuit position where the phase adjustment is necessary. Each of the distributing buffers 82-1 to 82-4 provided in the clock tree circuit 22 for the gate has a driving electric power corresponding to the number of branch outputs. In the delay setting circuit 64 in FIG. 5. The number of distribution outputs of the inverters 104-1 to 104-n corresponding to each distribution stage is naturally equal to 1. Thus, the delay setting circuit 64 can be realized as a circuit of a smaller scale than that of the clock tree circuit 22 for the gate.

In a manner similar to the delay setting circuit (first delay setting circuit) 64 of the system clock system, the delay setting circuit (second delay setting circuit) 80 provided for the system of the clock gate signal in FIGS. 3A and 3B is also constructed by an inverter delay using the (n) inverters in FIG. 5 having a delay element equivalent to that of the gate delay and the line delay in the clock tree circuit 22 for the gate.

Further, in the invention, a relation $$L1=L2$$

is provided between a line length L1 of the board line 40 for the system clock for supplying the system clock from the first unit 12 to the second unit 14 and a line length L2 of the board line 42 for the system clock for supplying the system clock to the first unit 12 itself, thereby equalizing their line lengths. The above relation is true of the board lines 44 and 46 for the clock gates. Assuming that a line length of the board line 44 for the clock gate is set to L3 and a line length of the board line 46 for the clock gate is set to L4, a relation $$L3=L4$$

is provided between them.

The relations L1=L2 and L3=L4 in which the line lengths are the same are provided between the board lines for supplying the system clock and the clock gate signal from the first unit 12 to the second unit 14 and the board lines for supplying the system clock and the clock gate signal by the first unit 12 itself, respectively, as mentioned above, thereby enabling the line delays due to the board lines from the phase adjusting circuit unit 18 of the first unit 12 to be equalized. Thus, for example, when considering the system clock as an example, the gate delay and the line delay in the circuit system from the input of the system clock E1 in the first unit 12 to the position of the clock 110 of the input of the gate 86-1 of the clock tree circuit 22 for the gate and the gate delay and the line delay in the circuit system from the input of the system clock E1 to the first unit 12 to the clock 112 at the inputting position of the PLL circuit 28 of the second unit 14 can be made coincident by the designing process of the first unit 12. Since the bypass circuits 56, 58, 72, and 74 are selected by the selectors 60, 62, 76, and 78, the total delay regarding the system clock and the clock gate signal can be minimized, so that the margin operation guarantee can be further enhanced.

Further, since the delay setting circuits 64 and 80 having the gate delay and the line delay of one system in the clock tree circuit 22 for the gate are provided for the same first unit 12, variations upon manufacturing the first unit 12 as a large scale semiconductor integrated circuits (LSIs) are almost the same. Therefore, even if the operational environments of the system board 10 changes largely and a variation in association with the environmental change is caused, the variations in the delay setting circuits 64 and 80 are almost the same as those in the clock tree circuit 22 for the gate. The fluctuation of the gate delay and the line delay in the clock tree circuit 22 for the gate caused by the variation on manufacturing in association with the environmental change appears in the delay setting circuits 64 and 80 in substantially the same manner. The deviation of the phase relation which is caused by the variation in association with the environmental change is minimized.

The case of setting the relations $$L1=L2, L3=L4$$

with respect to the line lengths of the board line between the first unit 12 and the second unit 14 and the board line of the first unit 12 itself has been mentioned above as an example. As another embodiment, if it is necessary to provide a predetermined phase delay for the clock 114 of the second unit 14 from the clock 110 of the first unit 12, a line length ΔL which gives a delay corresponding to a phase lag is obtained, the line length on the system clock side is set to $$(L1, L2+\Delta L),$$

the line length of the clock gate system is likewise set to $$(L3, L4+\Delta L)$$

In this manner, the line lengths can be made different.

In the first unit 12 in FIGS. 3A and 3B, a total delay in the case where the bypass circuits 56 and 58 are selected and the system clock is supplied to the second unit 14 and the first unit 12 itself will now be described as follows in comparison with the conventional apparatus in FIGS. 1A and 1B.

A delay value which is given by the delay setting circuit 64 provided for the first unit 12 in FIGS. 3A and 3B corresponds to a delay value of the phase/width adjusting circuit 212 of the first unit 202 in the conventional apparatus in FIGS. 1A and 1B. A delay construction component which is adjusted by the phase/width adjusting circuit 212 in the conventional apparatus is not a component obtained by considering the variation which is realized by using the delay elements in the clock tree circuit 22 for the gate as in the first unit 12 of the invention in FIGS. 3A and 3B but most of the delay value of the phase/width adjusting circuit 212 in the conventional apparatus comprises the gate delay. Therefore, a fluctuation ratio of the delay value in association with the change in operational environments is larger than that in the case of the line delay.

Even in the case where the adjustment value of the phase/width adjusting circuit 212 is adjusted to the minimum delay value in the first unit 202 in the conventional apparatus in FIGS. 1A and 1B, a total delay value regarding the system clock of the conventional apparatus is larger than the delay value of the bypass circuit 56, selector 60, and delay setting circuit 64 of the first unit 12 according to the invention in FIGS. 3A and 3B by a base delay a of the phase/width adjusting circuit 212.

That is, assuming that the clock total delay value of the invention according to the bypass circuit 56, selector 60, and delay setting circuit 64 in FIGS. 3A and 3B is equal to X1, a clock total delay value in the system of the phase/width adjusting circuit 212 in FIGS. 1A and 1B is equal to (X2+α). There is the following difference between the delay value X1 of the invention and the delay value X2 of the conventional apparatus. That is, although they are the same delay value in a certain environment, generally, in the ideal environment, when the environmental conditions or the like fluctuate from the ideal environment, there is a relation $$X1<X2.$$

As a specific example, assuming that the delay setting or the delay adjustment is made so as to make the phases of the clock 110 of the first unit 12 and the clock 112 of the second unit 14 in FIGS. 3A and 3B coincident and make the phases of the clock 260 of the first unit 202 and the clock 264 of the second unit 204 in the conventional apparatus in FIGS. 1A and 1B coincident, respectively, in the ideal environment, as shown in FIGS. 6A and 6B, the phases of the clocks 110 and 112 in the invention in FIGS. 6A and 6B are the same and the phases of the clocks 260 and 264 in the conventional apparatus in FIGS. 1A and 1B are the same, respectively. The ideal phase relation can be held. However, if the delay fluctuation occurs by the fluctuation in environmental conditions or the like, a difference in phase relation occurs between the invention and the conventional apparatus. FIGS. 6C and 6D show the phase relation between the clocks 110 and 112 in the embodiment in FIGS. 3A and 3B. As compared with the phase relation in the ideal environmental conditions in FIGS. 6A and 6B, a phase difference Δθ1 occurs between the clocks 110 and 112 because the environmental conditions or the like fluctuate. If the same fluctuation in environmental conditions or the like as those mentioned above occurs in the conventional apparatus in FIGS. 1A and 1B, a phase difference Δθ2 occurs between the clocks 260 and 264 as shown in FIGS. 6E and 6F. This value is larger than the phase difference Δθ1 in the invention in FIGS. 6C and 6D.

Such a difference between the phase difference Δθ1 in the invention and the phase difference Δθ2 in the conventional apparatus in association with the fluctuation in operational environments occurs because the delay setting circuit 64 in the invention is constructed as a circuit comprising delay elements equivalent to the gate delay and the line delay in the clock tree circuit 22 for the gate, the fluctuation almost equivalent to the fluctuation in the clock tree circuit 22 for the gate also occurs in the delay setting circuit 64 as for the fluctuation in environmental conditions, and the variations in association with the fluctuation in environmental conditions or the like are almost equivalent. The phase difference Δθ1 between the clock 110 on the first unit 12 side and the clock 112 in the second unit 14 is set to a small value.

On the other hand, in the phase/width adjusting circuit 212 in the conventional apparatus in FIGS. 1A and 1B, the gate delay and the line delay of the clock tree circuit 224 for the gate are not considered but only the delay value mainly comprising the gate delay in the phase/width adjusting circuit 212 is merely set. Therefore, the variation in the clock tree circuit 224 for the gate is not directly concerned with the variation in the phase/width adjusting circuit 212 to the fluctuation in operational environmental conditions, a peculiar variation occurs, and it becomes the large phase difference Δθ2. Therefore, according to the invention, since the phase difference Δθ1 caused from the same phase in the ideal environment by the fluctuation in environmental conditions or the like can be also suppressed to a sufficient small range, the margin operation compensation to the fluctuation in environmental conditions or the like can be improved.

The improvement of the margin operation compensation to the fluctuation in environmental conditions or the like in the invention as mentioned above is also obtained in a manner similar to the case on the delay setting circuit 64 side with respect to the supply of the clock gate signal from the delay setting circuit 80 to the second unit 14 and the supply of the clock gate signal from the selector 78 to the first unit 12 itself in the case where the bypass circuits 72 and 74 are selected by the selectors 76 and 78. Even if the fluctuation in environmental conditions or the like occurs for the ideal environment, the variation equivalent to that in the clock tree circuit 22 for the gate occurs in the delay setting circuit 80, so that the relation between the clock and the clock gate signal can be held constant.

Processes in the case where in the first unit 12 in FIGS. 3A and 3B, the phase/width adjusting circuits 52 and 54 are selected by the selectors 60 and 62 and, at the same time, the delay adjusting circuits 68 and 70 are selected by the selectors 76 and 78 will now be described. The phase/width adjusting circuits 52 and 54 provided in the first unit 12 correspond to the phase/width adjusting circuits 212 and 214 in the first unit 202 in the conventional apparatus in FIGS. 1A and 1B. The delay adjusting circuits 68 and 70 in the first unit 12 in FIGS. 3A and 3B correspond to the delay adjusting circuits 218 and 220 in the conventional apparatus in FIGS. 1A and 1B. Although the phase/width adjusting circuits 52 and 54 and the delay adjusting circuits 68 and 70 are used for the phase adjustment and the pulse width adjustment based on the measurement results of the clock adjustment testing apparatus in the conventional apparatus, the adjustments of the clock phase and the clock width using the clock adjustment testing apparatus are unnecessary and those circuits are not used for such adjustments in the invention.

In the invention, the phase/width adjusting circuits 52 and 54 and the delay adjusting circuits 68 and 70 in the first unit are used for actively setting a predetermined phase relation between the clock 110 of the first unit 12 and the clock 112 of the second unit 14, that is, the clock 114, for example, such a phase relation that the clock 112 is delayed from the clock 110 by a predetermined phase. That is, by providing the phase/width adjusting circuits 52 and 54 and the delay adjusting circuits 68 and 70 in the first unit 12 and selecting them by the selectors 60, 62, 76, and 78, the phase relation between the first unit 12 and the second unit 14 can be arbitrarily changed.

The clock width adjustment by the chopping circuit 50 and the phase/width adjusting circuits 52 and 54 provided in the first unit 12 in FIGS. 3A and 3B will now be described with reference to time charts of FIGS. 7A to 7G. FIG. 7A shows the system clock E1 which is inputted to the chopping circuit 50. Assuming that the minus system clock is used in the first unit 12 and the second unit 14, the chopping circuit 50 outputs a chop clock E2 having a clock width which is delayed by a predetermined time synchronously with a trailing edge of the system clock shown in FIG. 7B. The chop clock E2 is inputted to the phase/width adjusting circuits 52 and 54 and the pulse width, that is, a duty is adjusted in accordance with a preset adjustment amount. For example, when considering the phase/width adjusting circuit 52 as an example, as shown in FIGS. 7C to 7F, a plurality of delay clocks such as first delay clock, second delay clock, and third delay clock in which a trailing portion is delayed by every predetermined time by using the same zero delay clock as the chop clock E2 as a reference are sequentially generated. Assuming that, for example, the zero delay clock and the first, second, and third delay clocks of FIGS. 7C to 7F are selected as adjustment values, a width adjustment clock of FIG. 7G is formed by getting the OR of those clocks and outputted as a width-adjusted shift clock E3 to the selector 60.

In FIGS. 7A to 7G, the system clock E1 of a duty 50% of FIG. 7A is inputted and the width adjustment clock of FIG. 7G having the same duty 50% is outputted by the OR of the delay clocks of FIGS. 7C to 7F. However, in order to allow the clock on the second unit 14 side to have a predetermined relation in the clock width with respect to the first unit 12, the clock duty can be properly adjusted to the plus side or the minus side from 50% as necessary. The phase/width adjusting circuits 52 and 54 further have a plurality of delay circuits of different delay times so that they can be freely selected by a multiplexer, and can adjust the phase of the system clock by setting switching conditions of the multiplexer. The delay adjusting circuits 68 and 70 are obtained by excluding the adjusting function of the clock width shown in FIGS. 7A to 7G from the phase/width adjusting circuits 52 and 54 and leaving the circuit portion in which a plurality of delay circuits can be freely selected by the multiplexer.

Further, the processing operation of the clock gate generating circuit 66 provided in the first unit 12 in FIGS. 3A and 3B will be described. FIGS. 8A to 8C are time charts for generating the clock gate signal by the clock gate generating circuit 66. An on/off instruction of the system clock is supplied to the clock gate generating circuit 66 from the control circuit unit 26 or the like in FIG. 2 as shown in FIG. 8A. In response to the on/off instruction of the system clock, the system clock E1 of FIG. 8B is inputted from the system PLL circuit 16. Assuming that the system clock is a minus clock, the clock gate signal based on the on/off instruction needs to be switched in a plus interval where a valid portion of the system clock is not obtained. Therefore, the off instruction is given, for example, at time t1 and when the system clock is in the minus interval as a valid interval of the system clock, the clock gate signal is set to the L level as shown in FIG. 8C at arbitrary timing of a plus period T1 during which the next clock is not validated.

Subsequently, the on instruction of the clock is given at time t2 and assuming that the system clock is in the minus valid interval, at that time, the clock gate signal rises to the H level at arbitrary timing of a next invalid plus period T2. Therefore, the clock gate signal which changes at plus timing when the system clock is invalid is always supplied to the clock control circuit 20. The gate control based on the system clock in the control circuit unit of the first unit 12 distributed by the clock tree circuit 22 for the gate can be guaranteed.

Figure 9A:
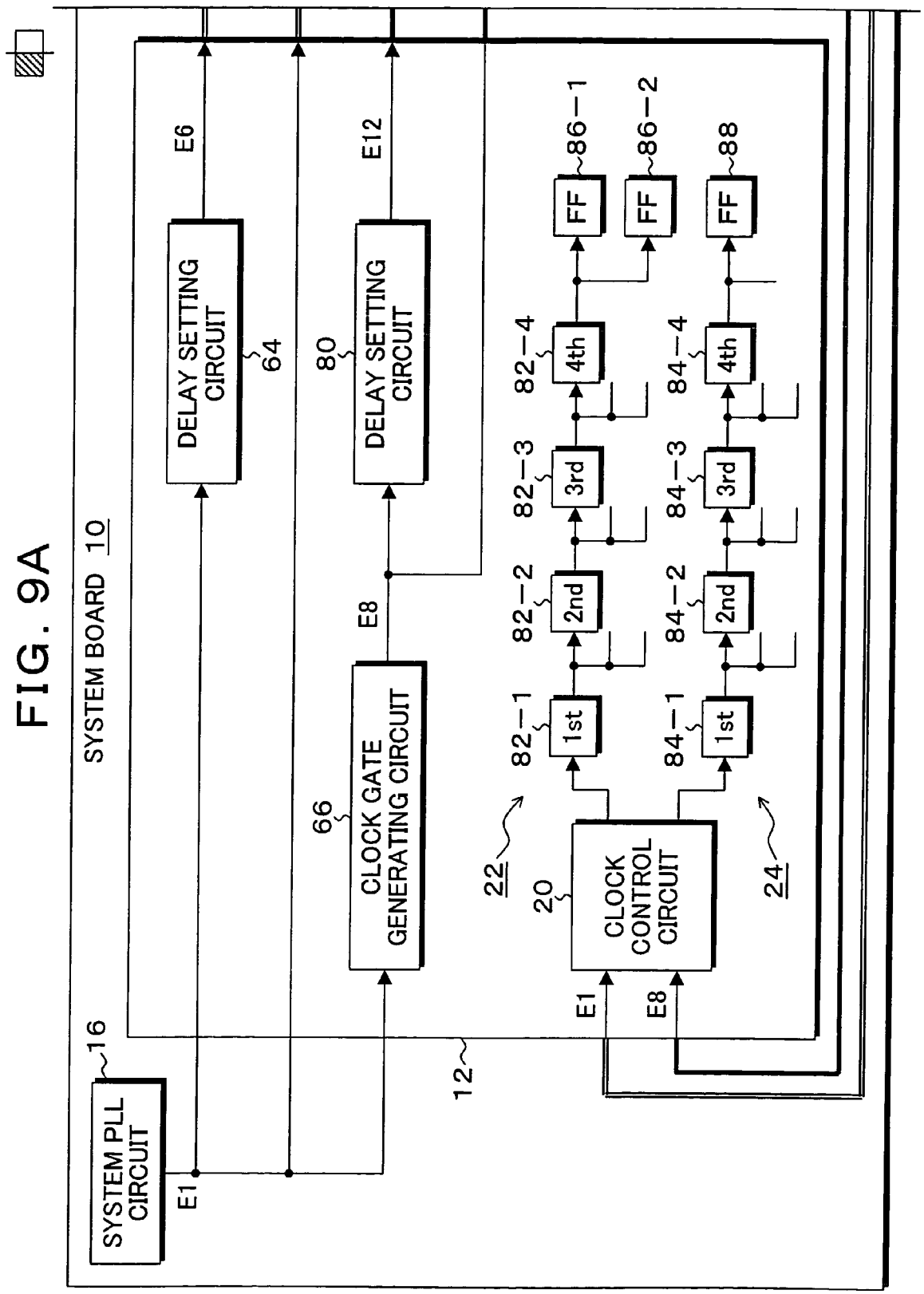
FIGS. 9A and 9B are circuit block diagrams of another embodiment of the information processing apparatus according to the invention.
Figure 9B:
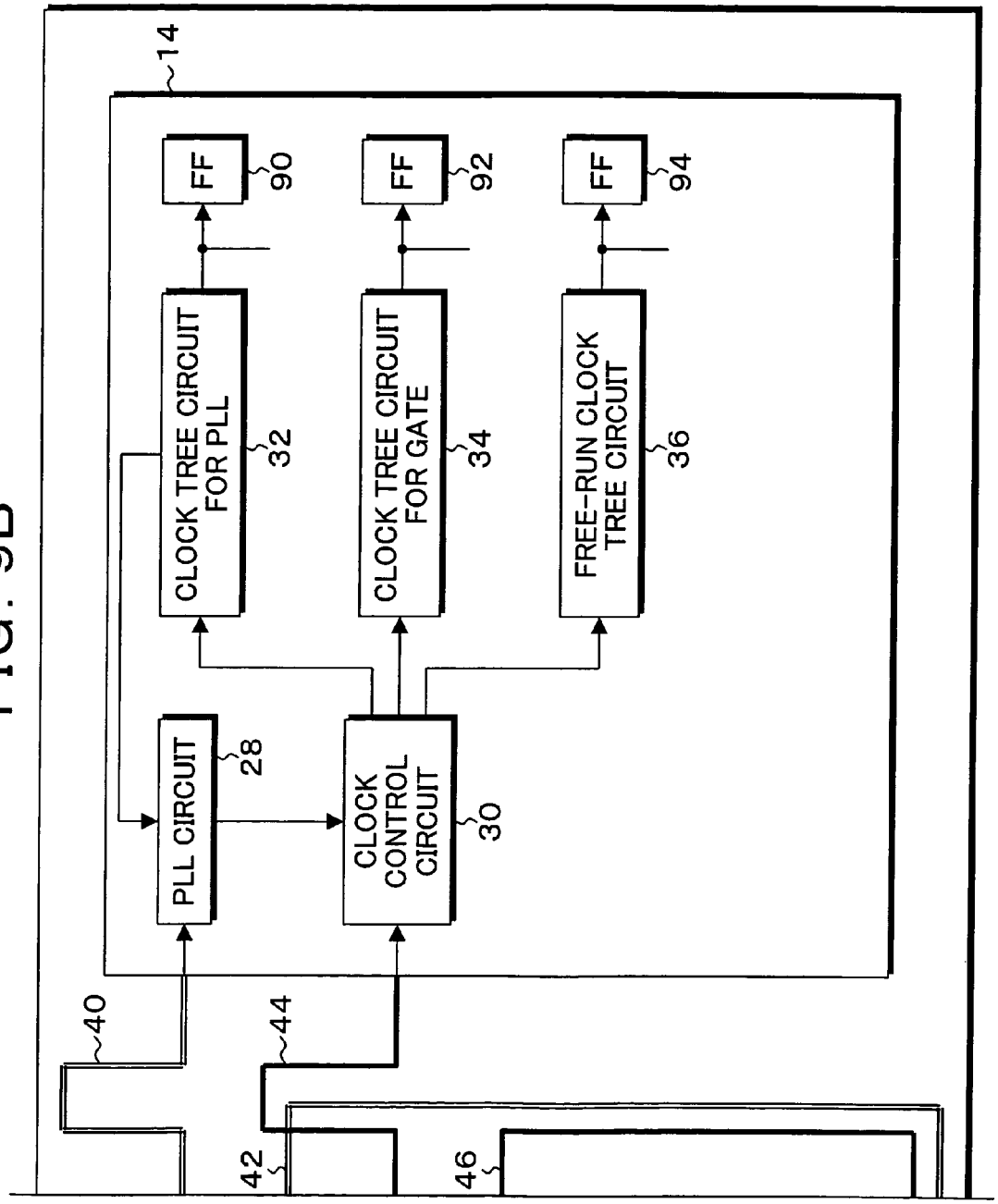

FIGS. 9A and 9B are circuit block diagrams showing another embodiment of the information processing apparatus according to the invention. In this embodiment, the phase adjusting circuit unit 18 for fixedly setting the same phase or a predetermined phase relation is provided between the first unit 12 and the second unit 14. Specifically speaking, as a phase adjusting circuit unit 18, only the delay setting circuits 64 and 80 and clock gate generating circuit 66 in the embodiment of FIGS. 3A and 3B are left and the other circuit portion is eliminated. The delay setting circuits 64 and 80 are realized by the delay elements equivalent to the gate delay and the line delay in the clock tree circuit 22 for the gate in a manner similar to the embodiment of FIGS. 3A and 3B, specifically speaking, the inverter delay as shown in FIG. 5.

With respect to the line lengths in the board lines 40, 42, 44, and 46 for supplying the system clock and the clock gate signal from the first unit 12 to the second unit 14 and to the first unit 12 itself, the relations

L1=L2, L3=L4 or (L1, L2+ΔL), (L3, L4+ΔL)

are set.

Also in the embodiment of FIGS. 9A and 9B, the clock adjustment using the clock adjustment testing apparatus at the manufacturing stage of the system board 10 is unnecessary. The deviation of the phase relation between the clock 110 of the first unit 12 and the clock 112 of the second unit 14 to the fluctuation in the operational environments or the like is minimized, so that the margin operation guarantee can be enhanced.

Although the above embodiment has been described with respect to the case where one second unit 14 is provided for the first unit 12 as an example, by providing a plurality of second units 14 for the first unit 12 and providing the constructions on the delay setting circuit 64 side according to the number of second units 14 for the first unit 12, it is possible to similarly cope with the embodiment. Although the above embodiment has been described with respect to the case where the phase relation of the second unit 14 side is delayed from the first unit 12 as an example, the phase of the second unit 14 side can be also advanced from the first unit 12 on the contrary. The invention incorporates proper modifications without departing from the object and advantages of the invention and is not limited by the numerical values shown in the embodiments.

What is claimed is:

1. An information processing apparatus, comprising:
a system clock generator which oscillates a system clock;
a first unit having
   a clock gate generating unit which generates a clock gate signal for controlling supply and stop of the system clock,
   a clock control unit which controls the supply and stop of the system clock on the basis of said clock gate signal, and
   a clock distributing unit which distributes the system clocks outputted from said clock control unit to a control circuit unit and makes said control circuit unit operative;
one or a plurality of second units each having
   a clock generator which uses the system clock outputted from said first unit as a reference clock, feeds back the system clock at a predetermined circuit position, and generates phase-coincident system clocks,
   a clock control unit which controls the supply and stop of said system clock outputted from said clock generator on the basis of said clock gate signal obtained from said first unit, and
   a clock distributing unit which distributes the system clock outputted from said clock control unit to said control circuit unit and makes the control circuit unit operative;
a system board on which said system clock generator, said first unit, and said second unit are mounted and which has board lines for individually supplying each of the system clock and the clock gate signal which are outputted from said first unit to the first unit itself and the second unit;
a first delay setting unit which is provided for a signal supply line of the system clock in the first unit to the second unit and in which a variation and delay elements which are equivalent to those of said clock distributing unit of said first unit have been set; and
a second delay setting unit which is provided for a signal supply line of the clock gate signal in the first unit to said second unit and in which the variation and the delay elements which are equivalent to those of the clock distributing unit of said first unit have been set.

2. An apparatus according to claim 1, wherein
the clock control unit of said first unit outputs a clock for a gate whose supply and stop have been controlled by said clock gate signal and continuous free-run clocks in parallel, and
the clock distributing unit of said first unit has a clock tree circuit for a gate which distributes said clock for the gate and a free-run clock tree circuit which distributes said free-run clock.

3. An apparatus according to claim 2, wherein said first and second delay setting units set a gate delay and a line delay which are equivalent to those of said clock tree circuit for the gate.

4. An apparatus according to claim 3, wherein said first and second delay setting units set the gate delay and the line delay which are equivalent to those of a circuit from a distribution start point in said clock distributing unit of the first unit to a predetermined gate input of a final end.

5. An apparatus according to claim 3, wherein said first and second delay setting units set said gate delay and said line delay by a circuit in which a plurality of inverters are connected like a chain.

6. An apparatus according to claim 1, wherein on said system board,
- a line length of the board line for supplying the system clock from said first unit to said first unit itself and that of the board line for supplying the system clock from said first unit to said second unit are the same, and
- a line length of the board line for supplying the clock gate signal from said first unit to the first unit itself and that of the board line for individually supplying the clock gate signal from said first unit to said second unit are also the same.

7. An apparatus according to claim 1, wherein on said system board,
- a line length of the board line for supplying the system clock from said first unit to said first unit itself is different from that of the board line for supplying the system clock from said first unit to said second unit by a predetermined line length, and
- a line length of the board line for supplying the clock gate signal from said first unit to the first unit itself is also different from that of the board line for individually supplying the clock gate signal from said first unit to said second unit by said predetermined line length.

8. An apparatus according to claim 1, wherein in said first unit,
- a phase/width adjusting circuit which adjusts a phase and a pulse width of the system clock, a bypass circuit which bypasses said phase/width adjusting circuit, and a selecting unit which selects one of outputs of said phase/width adjusting circuit and said bypass circuit and inputs the selected output to said first delay setting unit are provided on an input side of said first delay setting unit, and
- a phase adjusting circuit which adjusts a phase of the clock gate signal, a bypass circuit which bypasses said phase adjusting circuit, and a selecting unit which selects one of outputs of said phase adjusting circuit and said bypass circuit and inputs the selected output to said first delay setting unit are provided between said clock gate generating unit and said second delay setting unit.

9. An apparatus according to claim 1, wherein in said first unit,
- a phase/width adjusting circuit which adjusts a phase and a pulse width of the system clock, a bypass circuit which bypasses said phase/width adjusting circuit, and a selecting unit which selects one of outputs of said phase/width adjusting circuit and said bypass circuit and outputs the selected output to said board line are provided for the signal supply line of the system clock in the unit to its own clock control unit, and
- a phase adjusting circuit which adjusts a phase of the clock gate signal, a bypass circuit which bypasses said phase adjusting circuit, and a selecting unit which selects one of outputs of said phase adjusting circuit and said bypass circuit and outputs the selected output to said board line are provided for the signal supply line of the clock gate signal which is outputted from said clock gate generating unit.

10. An apparatus according to claim 1, wherein
- said clock control unit of the second unit outputs in parallel a clock for the clock generator which is not stopped by said clock gate signal, a clock for a gate whose supply and stop have been controlled by said clock gate signal, and continuous free-run clocks, and
- said clock distributing unit of the second unit comprises a clock tree circuit for the clock generator which distributes said phase-coincident system clocks for the clock generator, a clock tree circuit for a gate which distributes said clocks for the gate, and a free-run clock tree circuit which distributes said free-run clocks.

11. An apparatus according to claim 1, wherein said system clock generator is provided in said first unit.

* * * * *